United States Patent [19]
Takigawa

[11] 4,151,417
[45] Apr. 24, 1979

[54] ELECTRON BEAM EXPOSURE APPARATUS

[75] Inventor: Tadahiro Takigawa, Inagi, Japan

[73] Assignee: Vlsi Technology Research Association, Japan

[21] Appl. No.: 892,128

[22] Filed: Mar. 31, 1978

[30] Foreign Application Priority Data

Mar. 31, 1977 [JP] Japan .................................. 52-36650

[51] Int. Cl.² ............................................. G21K 1/08
[52] U.S. Cl. ................................ 250/396 R; 250/311; 250/492 A
[58] Field of Search .................... 250/396, 492 A, 311

[56] References Cited
U.S. PATENT DOCUMENTS

| | | | |
|---|---|---|---|
| 3,857,041 | 12/1974 | Spicer | 250/492 A |
| 3,876,883 | 4/1975 | Broers | 250/492 A |

*Primary Examiner*—Harold A. Dixon
*Attorney, Agent, or Firm*—Finnegan, Henderson, Farabow & Garrett

[57] ABSTRACT

An electron beam exposure apparatus comprises a pair of electrostatic deflecting plates so disposed that the center thereof in the direction of an advancing electron beam emitted from an electron gun is located on the crossover point of said beam, a variable voltage source for said deflecting plates and an aperture disposed in the path of the deflected electron beam.

7 Claims, 3 Drawing Figures

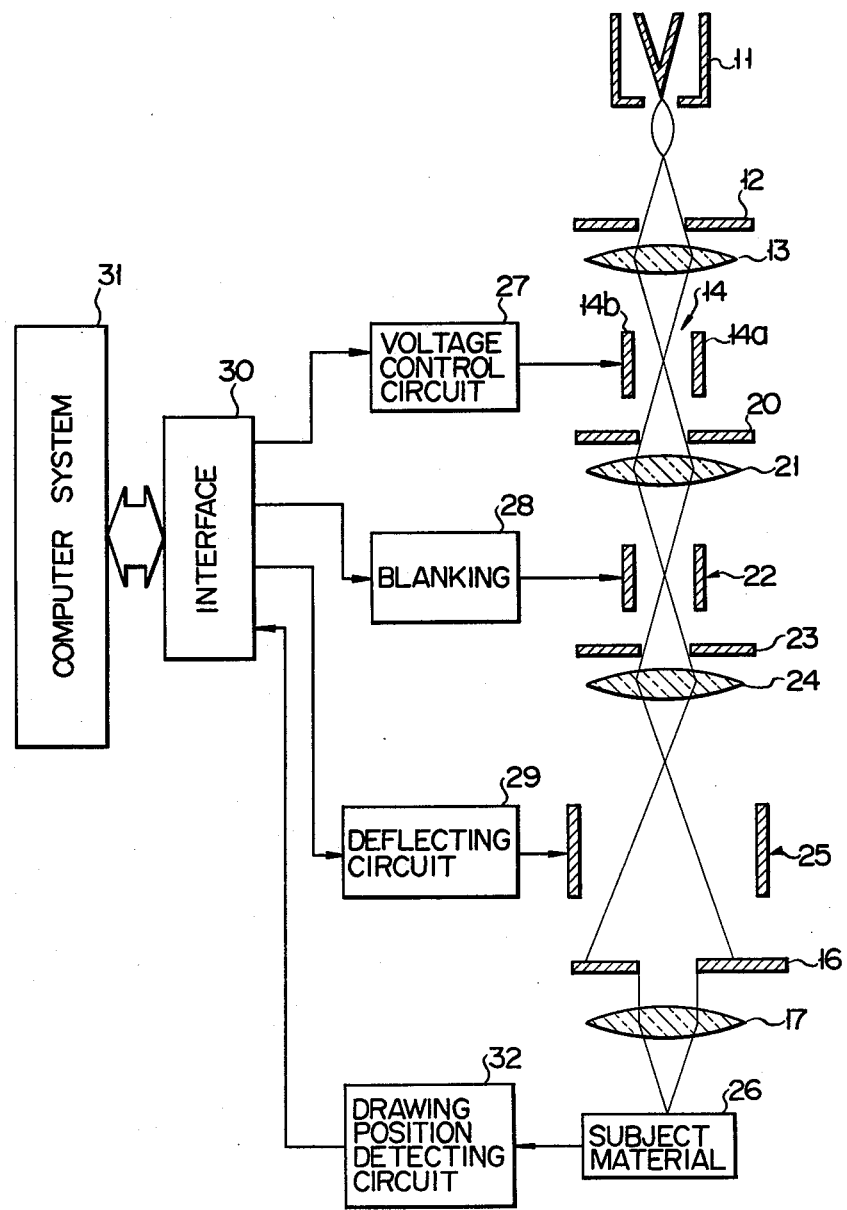

ELECTRON BEAM EXPOSURE APPARATUS

BACKGROUND OF THE INVENTION

This invention relates to an electron beam exposure apparatus, more specifically to an exposure apparatus capable of adjusting at need the exposure to an electron beam.

In exposing a subject material, e.g. photo-resist material by means of an electron beam exposure apparatus, it is necessary to adjust suitably the amount of electron beam applied to the photo-resist material according to the conditions thereof, such as pattern shape and thickness so as to overcome a proximity effect.

As means for adjusting the exposure to the electron beam, there are conventionally known the following systems.

(1) Means for changing the magnification of a condenser lens.

(2) Means for changing the grid bias voltage of an electron beam generator.

(3) Means for changing the drawing (exposure) speed.

According to the first means, the diameter, advancing path and converging position of the electron beam on the subject material will vary if the magnification of the condenser lens is changed. In addition, the magnification of the condenser lens cannot be changed in a short time.

According to the second means, the diameter and beam position of the electron beam will vary in the same manner as the case of the first means, and the capacity of an electron gun is large, failing to make a high-speed change in the voltage.

As for the third means, it cannot be applied to the random scanning system in which the drawing speed is preset, though a satisfactory result may be obtained with the vector scanning system. After all, in the prior art apparatuses employing these systems, it has been very difficult to ensure high-accuracy exposure to electron beam because the amount of electron beam applied has not been able to be adjusted effectively.

SUMMARY OF THE INVENTION

An object of this invention is to provide an electron beam exposure apparatus capable of controlling the exposure of a subject material to an electron beam incident thereupon at a high speed in accordance with the optimum exposure conditions of the subject material to overcome a proximity effect without changing the incidence diameter and converting position of the electron beam.

BRIEF DESCRIPTION OF THE DRAWING

FIG. 3 is a schematic view of an electron beam exposure apparatus according to another embodiment of the invention

DETAILED DESCRIPTION OF THE PREFERRED EMBODIMENTS

Now there will be described the electron beam exposure apparatus according to the embodiments of this invention with reference to the accompanying drawings.

Figure 1:
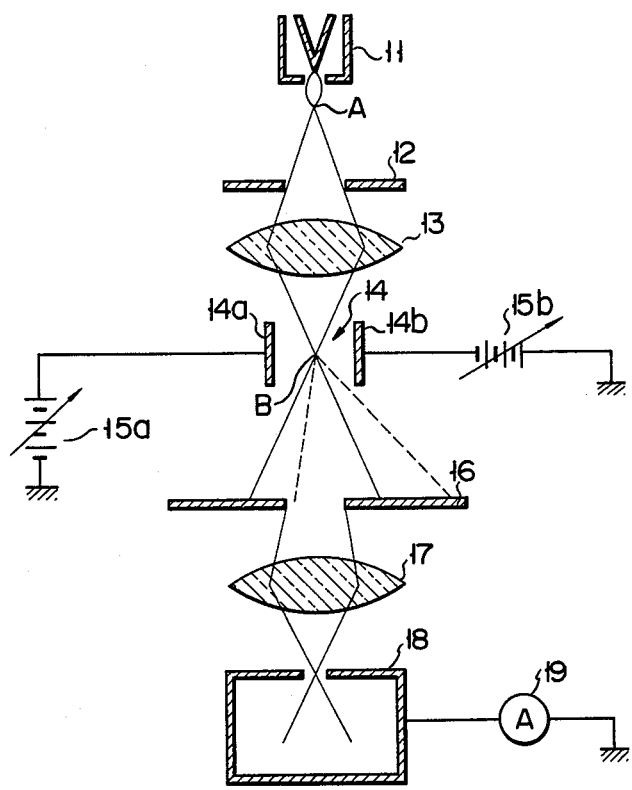
FIG. 1 is a schematic view of an electron beam exposure apparatus according to a first embodiment of this invention.

In an apparatus according to a first embodiment as shown in FIG. 1, numeral 11 denotes a well-known electron gun with a tungsten electrode, for example, in front of which a condenser lens slit 12 and a condenser lens 13 are disposed in order, an electron beam emitted from the electron gun 11 being so defined by the slit 12 as to have a predetermined cross section and incident upon the condenser lens 13. This electron beam has a crossover point A formed by the electron gun 11 and a crossover point B formed by the condenser lens 13. The crossover point B is located on the focus of the lens 13, and a pair of electrostatic deflecting plates 14a and 14b are disposed facing each other on each side of the crossover point B. These deflecting plates are formed of rectangular plates, and the condenser lens 13 is previously controlled so as to locate the crossover point B in the passage of the beam between these two plates. One deflecting plate 14a is connected to a variable voltage source 15a while the other deflecting plate 14b is connected to a conventional variable voltage power source 15b so that one source 15a applies forward voltage and the other source 15b reverse voltage. Thus, the deflection voltage of a deflecting device 14 provided with the deflecting plates 14a and 14b may be varied by operating the variable voltage power sources 15a, 13b. Arranged in front of the pair of deflecting plate 14a and 14b is an aperture 16, in front of which an object lens 17 is disposed. The electron beam deflected and controlled by the deflecting plates 14a and 14b is so regulated as to have a rectangular cross section, and is caused to be incident upon the object lens 17. This incident beam, converged by the object lens, is applied to a Faraday cup 18 disposed in the forward position. The Faraday cup 18 is connected with an ammeter 19 which detects the exposure. The Faraday cup 18 is intended for detecting the exposure, and will, in actual operation of the apparatus, be replaced by a subject material upon which the beam from the object lens 17 is indicent.

Figure 2:
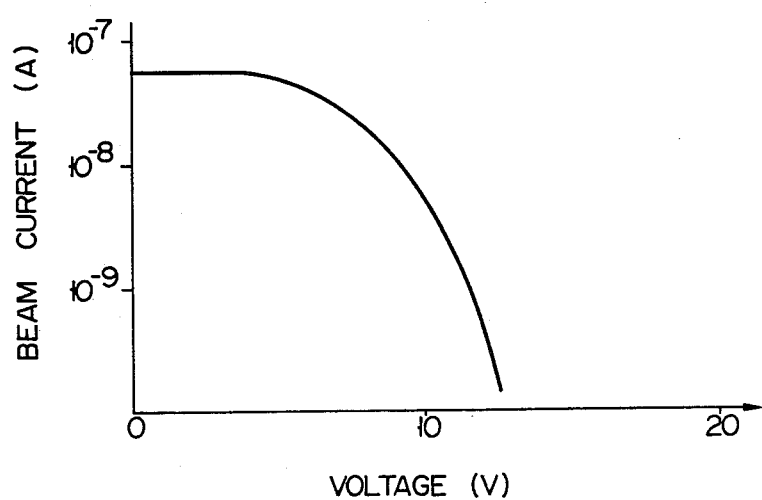
FIG. 2 is a diagram showing the relation between the degree of deflection (applied voltage) and exposure (beam current) of the electron beam of the apparatus of FIG. 1.

In the exposure apparatus so constructed as described above, the crossover point B formed by the condenser lens 13 is located on the center of the passage of the beam between the electrostatic deflecting plates 14a and 14b, forming the source of the beam to be incident upon the object lens 17. Therefore, the converging position of the electron beam, as well as its diameter, on the surface of the subject material will not change if the electron beam is deflected by the electrostatic deflecting plates 14a and 14b. Further, if the electron beam is deflected, only the amount of electron beam incident upon the object lens 17 through the aperture 16 is reduced. Accordingly, when the voltage applied to the electrostatic deflecting plates 14a and 14b is changed by means of the variable voltage power sources 15a, 15b, the amount of the electron beam (electron beam current) applied to the Faraday cup 18 varies as shown in FIG. 2. In FIG. 2 the axis of abscissa represents the voltage applied to the deflecting plates, while the axis of ordinate stands for the amount of electron beam (beam current) applied to the Faraday cup 18, the amount being measured by means of the ammeter 19. Thus, in this apparatus, the beam current may be varied by changing the applied voltage within a range from about 8 to 12V. Naturally, at this time, the converging position and diameter of the electron beam on the Faraday cup 18 would never change. Since the amount of electron beam applied can be changed simply by changing the voltage applied to the deflecting plates, such change may be made at a high speed.

If the apertures 12, 16 are of a rectangular shape, the change in exposure caused by the deflection of the electron beam will be made substantially rectilinear, securing ease of control. Instead of being rectangular, however, the aperture may be circular or elliptic, for example. In this case, the change of amount of the beam applied is not rectilinear, somewhat complicating the control. However, the degree of deflection corresponds to the exposure, so that the control may be effected by any suitable method. Also in this case, neither the converging position nor the diameter of the electron beam will change.

Referring now to FIG. 3, there will be described another embodiment of this invention.

Just as in the aforesaid embodiment, there is shown the electron gun 11 in front of which the first aperture 12, condenser lens 13, and the first deflecting device 14 composed of the pair of deflecting plates 14a and 14b are arranged in order. The first condenser lens 13 is so controlled that the electron beam from the electron gun 11, converged by the condenser lens 13, has its crossover point located on the central point in the passage of the beam between the two deflecting plates 14a and 14b.

Successively disposed in front of the deflecting plates 14a and 14b of the deflecting device 14 are a second aperture 20, second condenser lens 21, second electrostatic deflecting device 22, third aperture 23, third condenser lens 24, third deflecting device 25, object aperture 16 and object lens 17, through which the electron beam is applied to a subject material 26. The first deflecting device 14 is used for controlling the exposure current, and the crossover point of the electron beam is in alignment with the central point between the deflecting plates 14a and 14b, which functions as a beam source. The second electrostatic deflecting device 22 is used for blanking, while the third electrostatic deflecting device 25 has a function to deflect and scan the electron beam. The first, second and third deflecting devices 14, 22 and 25 are connected with a voltage control circuit 27, a blanking circuit 28 and a deflecting circuit 29, respectively. The voltage control circuit 27, which is used for applying to the first deflecting device 14 a deflecting voltage corresponding to the input signal, may be designed easily by one skilled in the art. The blanking circuit 28 and deflecting circuit 29 used may be any ones well-known in the field. The input sides of these circuits 27, 28 and 29 are connected to a computer system 31 through an interface 30. Also connected to the interface 30 is the output side of a drawing position detecting circuit 32, which is of a well-known type to detect the position of incidence of the electron beam upon the subject material 26 and produce an output signal indicating such position of incidence.

In the apparatus with the aforementioned construction, the crossover point of the electron beam is in alignment with the central point of the electrostatic deflecting device, the amount of the electron beam emitted from the crossover point and having passed through the second aperture 20 being adjusted by controlling the voltage control circuit 27 in cooperation with the aperture 20. The adjusted electron beam is blanking-controlled by the second electrostatic deflecting device 22 operated by the blanking circuit 28, and further deflected by the third electrostatic deflecting device 25 operated by the deflecting circuit 29. Thereafter, thus controlled electron beam is converged by means of the object lens 17, and applied to prescribed portions of the subject material 26. The exposure information or drawing position information of the subject material 26 is detected by the drawing position detecting circuit 32, and supplied to the computer system 31. Then, the prescribed portions of the subject material 26 are successively continuously exposed to the beam in accordance with the detection information.

Although in the aforementioned embodiment the electrostatic deflecting devices for exposure current control and for blanking are separately provided, these two types of control may be performed by means of a single common electrostatic deflecting device. Instead of being composed of a pair of deflecting plates, the deflecting device for current control may be formed of two pairs of deflecting plates which allow the electron beam to be deflected not only in one direction but in another direction, e.g. a direction perpendicular to said one direction. Either the subject material or the incident electron may be moved, provided the subject material is allowed to be scanned by the beam.

What is claimed is:

1. An electron beam exposure apparatus comprising an electron beam emitter means, an electrostatic deflecting device so disposed that the center thereof in the direction of the passage of an electron beam emitted from said means is located on the crossover point of said beam, a variable voltage power source for applying voltage to said electrostatic deflecting device and deflecting said electron beam, and an aperture means disposed in the path of the deflected electron beam.

2. An electron beam exposure apparatus according to claim 1, wherein said electron beam emitter means includes an electron gun and a condenser lens to converge the electron beam from said electron gun into the center of said electrostatic deflecting device.

3. An electron beam exposure apparatus according to claim 2 further comprising an object lens for converging the electron beam from said aperture means onto a subject material.

4. An electron beam exposure apparatus according to claim 3, wherein another electrostatic deflecting device for deflecting the electron beam from said aperture means is disposed between said object lens and said aperture means.

5. An electron beam exposure apparatus according to claim 4, wherein an electrostatic deflecting device for blanking is further disposed between said aperture means and said another electrostatic deflecting device.

6. An electron beam exposure apparatus according to claim 1, wherein said electrostatic deflecting device has a pair of deflecting plates facing each other.

7. An electron beam exposure apparatus according to claim 6, wherein said aperture means has a rectangular aperture.

* * * * *